(12) United States Patent
Nagaoka et al.

(10) Patent No.: US 9,825,123 B2
(45) Date of Patent: Nov. 21, 2017

(54) SCHOTTKY BARRIER DIODE AND METHOD FOR MANUFACTURING THE SAME

(71) Applicants: Toyota Jidosha Kabushiki Kaisha, Toyota-shi, Aichi-ken (JP); Denso Corporation, Kariya-shi, Aichi-ken (JP)

(72) Inventors: Tatsuji Nagaoka, Nagakute (JP); Hiroki Miyake, Toyota (JP); Yukihiko Watanabe, Nagakute (JP); Sachiko Aoi, Nagakute (JP); Atsuya Akiba, Kariya (JP)

(73) Assignees: Toyota Jidosha Kabushiki Kaisha, Toyota-shi (JP); Denso Corporation, Kariya-shi (JP)

( * ) Notice: Subject to any disclaimer, the term of this patent is extended or adjusted under 35 U.S.C. 154(b) by 0 days.

(21) Appl. No.: 14/975,961

(22) Filed: Dec. 21, 2015

(65) Prior Publication Data

US 2016/0181355 A1 Jun. 23, 2016

(30) Foreign Application Priority Data

Dec. 22, 2014 (JP) ................................ 2014-259316

(51) Int. Cl.
*H01L 29/06* (2006.01)
*H01L 29/16* (2006.01)
(Continued)

(52) U.S. Cl.
CPC ...... *H01L 29/0619* (2013.01); *H01L 29/0692* (2013.01); *H01L 29/1608* (2013.01); *H01L 29/66143* (2013.01); *H01L 29/872* (2013.01)

(58) Field of Classification Search
CPC .................................................. H01L 29/66143
See application file for complete search history.

(56) References Cited

U.S. PATENT DOCUMENTS

2007/0235768 A1* 10/2007 Nakazawa ........ H01L 29/66212
257/211
2007/0272979 A1 11/2007 Saito et al.
(Continued)

FOREIGN PATENT DOCUMENTS

JP 2008-004643 A 1/2008
JP 2009-016603 A 1/2009
(Continued)

*Primary Examiner* — Peniel M Gumedzoe
*Assistant Examiner* — Christopher Johnson
(74) *Attorney, Agent, or Firm* — Dinsmore & Shohl LLP

(57) ABSTRACT

A Schottky barrier diode provided herein includes: a semiconductor substrate; and an anode electrode being in contact with the semiconductor substrate. The semiconductor substrate includes: p-type contact regions being in contact with the anode electrode; and an n-type drift region being in contact with the anode electrode by Schottky contact in a range where the p-type contact regions are not provided The p-type contact regions includes: a plurality of circular regions located so that the circular regions are arranged at intervals between an outer side and an inner side at a contact surface between the semiconductor substrate and the anode electrode; and an internal region located in an inner portion of the circular region located on an innermost side at the contact surface and connected to the circular region located on the innermost side at the contact surface.

7 Claims, 4 Drawing Sheets

(51) Int. Cl.
*H01L 29/872* (2006.01)
*H01L 29/66* (2006.01)

(56) References Cited

U.S. PATENT DOCUMENTS

| | | | |
|---|---|---|---|
| 2009/0008651 A1 | 1/2009 | Okuno et al. | |
| 2014/0284620 A1 | 9/2014 | Ota et al. | |
| 2015/0069414 A1* | 3/2015 | Kono | H01L 29/872 257/77 |
| 2015/0206941 A1* | 7/2015 | Uehigashi | H01L 29/872 257/77 |

FOREIGN PATENT DOCUMENTS

| | | |
|---|---|---|
| JP | 2009-094433 A | 4/2009 |
| JP | 2012-094683 A | 5/2012 |
| JP | 2014-060276 A | 4/2014 |
| JP | 2014-187115 A | 10/2014 |

* cited by examiner

SCHOTTKY BARRIER DIODE AND METHOD FOR MANUFACTURING THE SAME

CROSS-REFERENCE TO RELATED APPLICATION

This application claims priority to Japanese Patent Application No. 2014-259316 filed on Dec. 22, 2014, the contents of which are hereby incorporated by reference into the present application.

TECHNICAL FIELD

A technology disclosed herein relates to a Schottky barrier diode and a method for manufacturing the same.

DESCRIPTION OF RELATED ART

Japanese Patent Application Publication No. 2009-94433 (hereinafter referred to as "patent document 1") discloses a Schottky barrier diode (hereinafter referred to as "SBD"). The SBD includes: a semiconductor substrate and an anode electrode being in contact with the semiconductor substrate. The semiconductor substrate includes: p-type contact regions being in contact with the anode electrode; and an n-type drift region being in contact with the anode electrode by Schottky contact in a range where the p-type contact regions are not provided. The p-type contact regions include: a single ring region extending along an outer circumference of the anode electrode; and a plurality of stripe patterned regions located in an inner portion of the ring region. Each of the stripe patterned regions is connected to the ring region. Further provided around the anode electrode (i.e. in an outer portion of the ring region) are p-type FLRs (field limiting rings) extending so as to surround the anode electrode. The FLRs are not in contact with the anode electrode. Application of a forward voltage to the SBD causes electrons to flow from the n-type drift region to the anode electrode through a Schottky interface between the anode electrode and the n-type drift region. This causes the SBD to be turned on. On the other hand, application of a backward voltage to the SBD stops the aforementioned flow of electrons, thus causing the SBD to be turned off. Further, when the SBD is turned off, depletion layer spread from the p-type contact regions to a portion of the n-type drift region that is located around the p-type contact regions. The depletion layer spreads so as to cover the Schottky interface. This prevents generation of a high electric field in an area in vicinity of the Schottky interface.

BRIEF SUMMARY

In the SBD of the patent document 1, the ring region is provided at an outer edge of a contact surface between the semiconductor substrate and the anode electrode. Therefore, when the SBD is turned off, a depletion layer extends from the ring region into a region located outer than the anode electrode (i.e. a region that is not covered with the anode electrode; hereinafter referred to as "peripheral region"). Meanwhile, the stripe patterned regions are connected to the ring region. Areas in vicinity of connected portions of the ring region to which the stripe patterned regions are connected have a higher p-type region ratio than areas in vicinity of non-connected portions of the ring region to which the stripe patterned regions are not connected. Therefore, the depletion layer extends more easily around the connected portions than around the non-connected portions. For this reason, the depletion layer extends from the ring region into the peripheral region faster in the areas in vicinity of the connected portions than in the areas in vicinity of the non-connected portions. Therefore, as shown in FIG. 6, in a process during which a depletion layer 120 extends from a ring region 100 into a peripheral region 110, the depletion layer 120 becomes wider in areas in vicinity of connected portions 102 of the ring region 100 than in areas in vicinity of non-connected portions 104 of the ring region 100. As a result, the depletion layer 120 has its outer edge in a wavy shape. For this reason, the SBD of the patent document 1 has such a problem that electric field easily concentrates in the peripheral region 110 and the peripheral region 110 is low in withstand voltage. The SBD of the patent document 1 is a type of SBD in which no holes flow from the p-type contact regions into the n-type drift region when the SBD is turned on. This type of SBD is called a JBSD (Junction Barrier Schottky Diode). On the other hand, there is a type of SBD in which holes flow from the p-type contact regions into the n-type drift region when the SBD is turned on (i.e. a type of SBD in which both electrons and holes contribute to current). This type of SBD is called an MPSD (Merged PIN Schottky Diode). When the MPSD is turned off, the MPSD operates in a same manner as the aforementioned JBSD does. Therefore, the MPSD has a problem which is similar to that of the JBSD. Therefore, the present specification provides a technology for improving withstand voltage in an SBD including p-type contact regions and an n-type drift region at a contact surface between a semiconductor substrate and an anode electrode (i.e. in an SBD encompassing a JBSD and an MPSD).

A Schottky barrier diode disclosed herein comprises: a semiconductor substrate; and an anode electrode being in contact with the semiconductor substrate. The semiconductor substrate comprises: p-type contact regions being in contact with the anode electrode; and an n-type drift region being in contact with the anode electrode by Schottky contact in a range where the p-type contact regions are not provided. The p-type contact regions comprise: a plurality of ring regions located so that the ring regions are arranged at intervals from an outer side to an inner side at a contact surface between the semiconductor substrate and the anode electrode; and an internal region located in an inner portion of the ring region located on an innermost side at the contact surface and connected to the ring region located on the innermost side at the contact surface.

The term "inner side" as used herein means a side with respect to a ring region on which a region surrounded by the ring region is located, and the term "outer side" as used herein means a side with respect to a ring region that is outside a region surrounded by the ring region. Further, the term "inner portion" as used herein means a region surrounded by a ring region, and the term "outer portion" as used herein means a region that is outside a region surrounded by a ring region.

In this SBD, the internal region is connected to the ring region (hereinafter referred to as "first ring region") located on the innermost side. For this reason, a depletion layer extends more easily around a connected portion of the first ring region to which the internal region is connected than around a non-connected portion of the first ring region to which the internal region is not connected. For this reason, the depletion layer, which extends from the first ring region into an outer portion of the first ring region, has its outer edge in a wavy shape. In this SBD, however, another ring region (hereinafter referred to as "second ring region") is provided in the contact surface so as to surround the first circular region. As with the first ring region, the second ring region is in contact with the anode electrode. Therefore, a depletion layer extends from the second ring region at substantially a same time as the depletion layer extends from the first ring region. A portion of the n-type drift region that is located between the first ring region and the second ring region is pinched off by the depletion layers extending from the first ring region and the second ring region. That is, the wavy-edged depletion layer extending from the first ring region and the depletion layer extending from the second ring region are combined to make a single depletion layer. For this reason, electric field concentration due to the influence of the wavy-edged depletion layer does not occur in the pinched-off region. Further, a depletion layer extends from the ring region located on the outermost side into an outer portion (i.e. a peripheral region) of the ring region. The internal region is not connected to the ring region located on the outermost side. This allows the depletion layer to uniformly extend from this ring region over into the peripheral region. Therefore, the electric field concentration is suppressed also in the peripheral region. Therefore, this SBD is high in withstand voltage.

A method for manufacturing a Schottky barrier diode is disclosed herein. This method comprises formation of p-type regions and formation of an anode electrode. In the formation of p-type regions, p-type impurities are implanted into a semiconductor substrate being of n-type to form p-type regions exposed on a surface of the semiconductor substrate. The p-type regions comprise a plurality of ring regions and an internal region. The plurality of ring regions is arranged with intervals from an outer side to an inner side, and includes a first plurality of ring regions located on the inner side and a second plurality of ring regions located on the outer side. The internal region is located in an inner portion of the ring region located on an innermost side at the contact surface. The internal region is connected to the ring region located on the innermost side at the contact surface.

In this method, the first plurality of ring regions that are in contact with the anode electrode serves as ring regions, and the second plurality of ring regions that are not in contact with the anode electrode serves as FLRs. This method allows the internal region and the ring regions, which are in contact with the anode electrode, to be formed at the same time as the FLRs.

BRIEF DESCRIPTION OF DRAWINGS

FIG. 4 is an explanatory diagram of a depletion layer extending from the ring p-type contact region 22a into an outer portion of the ring p-type contact region 22a;

DETAILED DESCRIPTION

Embodiments

Figure 1:
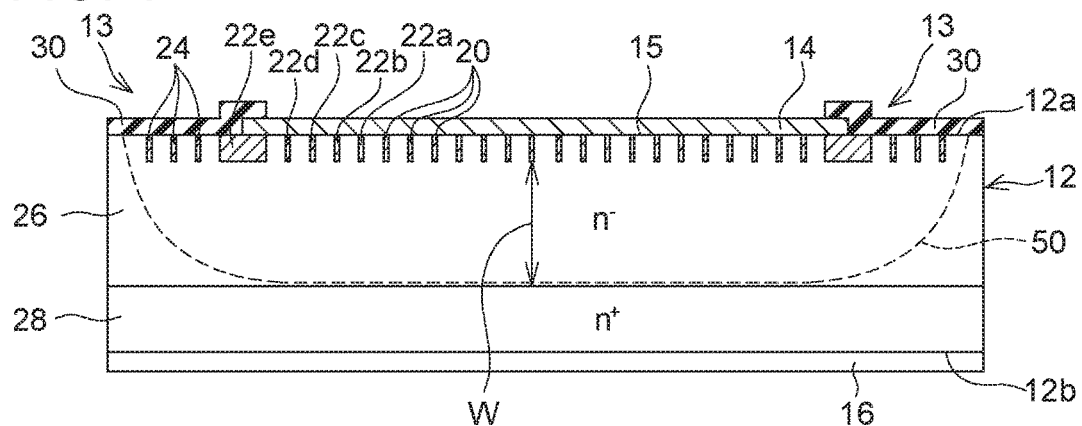
FIG. 1 is a longitudinal section view of an SBD 10 according to an embodiment (as taken along a line I-I in FIG. 2)
Figure 2:
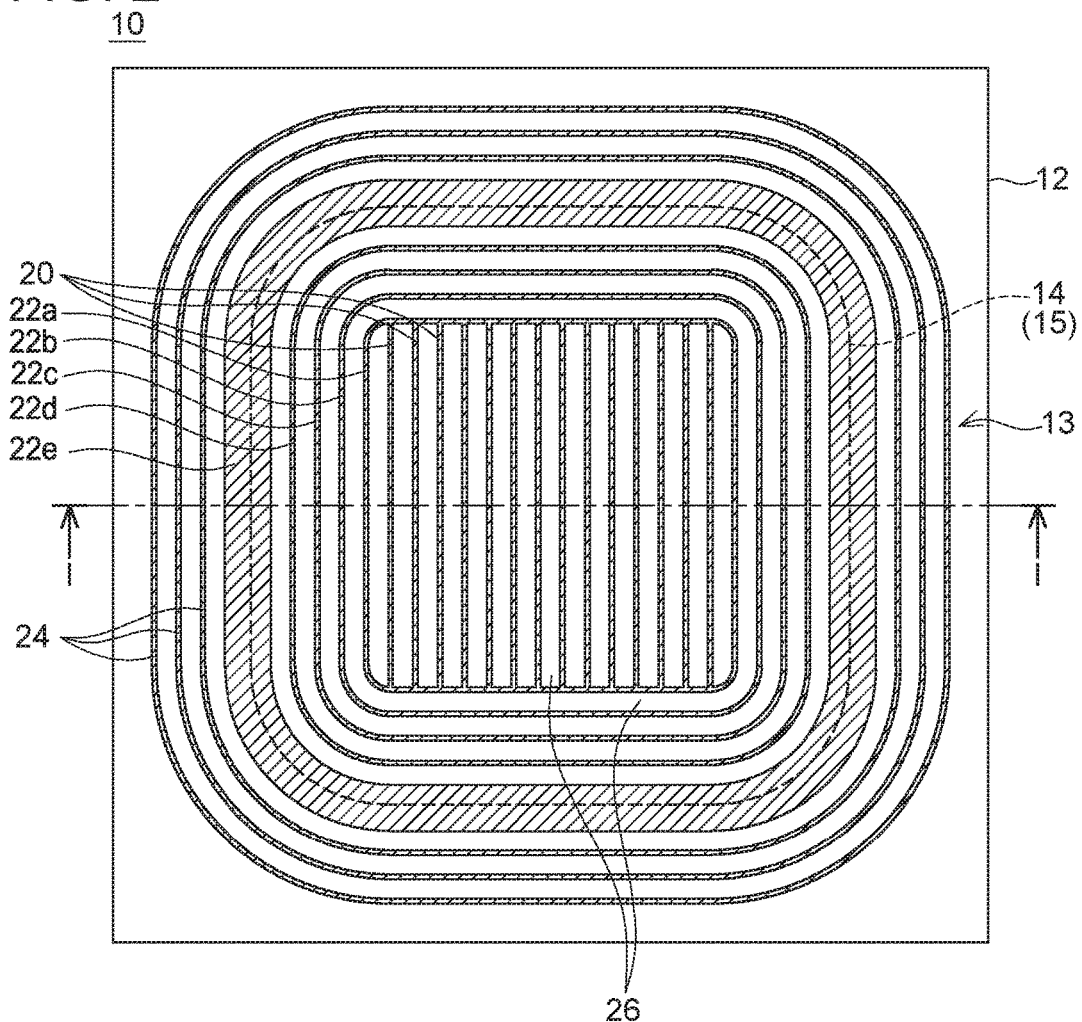

FIGS. 1 and 2 show an SBD 10 according to an embodiment. The SBD 10 includes a semiconductor substrate 12. In FIG. 2, p-type regions are indicated by diagonal hatching. The semiconductor substrate 12 is made of SiC. The semiconductor substrate 12 has an upper surface 12a on which an anode electrode 14 and an insulating film 30 are provided. A dotted line 14 in FIG. 2 indicates a range in which the anode electrode 14 is provided (i.e. a contact surface 15 where the semiconductor substrate 12 and the anode electrode 14 are in contact with each other). The anode electrode 14 is provided in a central part of the upper surface 12a of the semiconductor substrate 12. A region of the upper surface 12a that is not covered with the anode electrode 14 (i.e. a region on an outer side of the dotted line 14; hereinafter referred to as a "peripheral region 13") is covered with the insulating film 30. The semiconductor substrate 12 has a lower surface 12b on which a cathode electrode 16 is provided.

Provided in an inner part of the semiconductor substrate 12 are stripe patterned p-type contact regions 20, ring p-type contact regions 22a to 22e, FLRs 24, a drift region 26, and a cathode region 28. It should be noted that the following description may refer to the ring p-type contact regions 22a to 22e collectively as "ring p-type contact regions 22".

The stripe patterned p-type contact regions 20, the ring p-type contact regions 22, and the FLRs 24 are provided in a range exposed on the upper surface 12a of the semiconductor substrate 12. As shown in FIG. 2, the stripe patterned p-type contact regions 20 and the ring p-type contact regions 22 are provided in a portion of the upper surface 12a of the semiconductor substrate 12 that is located within the contact surface 15. The stripe patterned p-type contact regions 20 and the ring p-type contact regions 22 are in contact with the anode electrode 14 by a Schottky contact. The FLRs 24 are provided in a portion of the upper surface 12a of the semiconductor substrate 12 that is located outside of the contact surface 15. That is, the FLRs 24 are provided within the peripheral region 13. The FLRs 24 have their upper surfaces covered with the insulating film 30. As shown in FIG. 1, the stripe patterned p-type contact regions 20, the ring p-type contact regions 22, and the FLRs 24 are provided only in a surface part in vicinity of the upper surface 12a of the semiconductor substrate 12.

As shown in FIG. 2, each of the ring p-type contact regions 22 extends in a circle shape within the contact surface 15. Each of the ring p-type contact regions 22 has a quadrangular shape having corners chamfered in a form of circular arcs. Each of the ring p-type contact regions 22 has linear portions each shaped in a straight line and corner portions each shaped in a circular arc. The ring p-type contact regions 22 are located so that the ring p-type contact regions 22a to 22e are arranged at intervals from an outer side to an inner side. That is, the ring p-type contact region 22d is located in an inner portion of the ring p-type contact region 22e, the ring p-type contact region 22c is located in an inner portion of the ring p-type contact region 22d, the circular p type contact region 22b is located in an inner portion of the ring p-type contact region 22c, and the ring p-type contact region 22a is located in an inner portion of the ring p-type contact region 22b. The ring p-type contact region 22e located on an outermost side has a greater width than any of the other ring p-type contact regions 22. A portion of the ring p-type contact region 22e that is on the inner side than a center of the width is positioned within the contact surface 15, whereas a portion of the ring p-type contact region 22e that is on the outer side than the center of the width protrudes outside the contact surface 15. The ring p-type contact regions 22a to 22d are entirely positioned within the contact surface 15.

Figure 3:
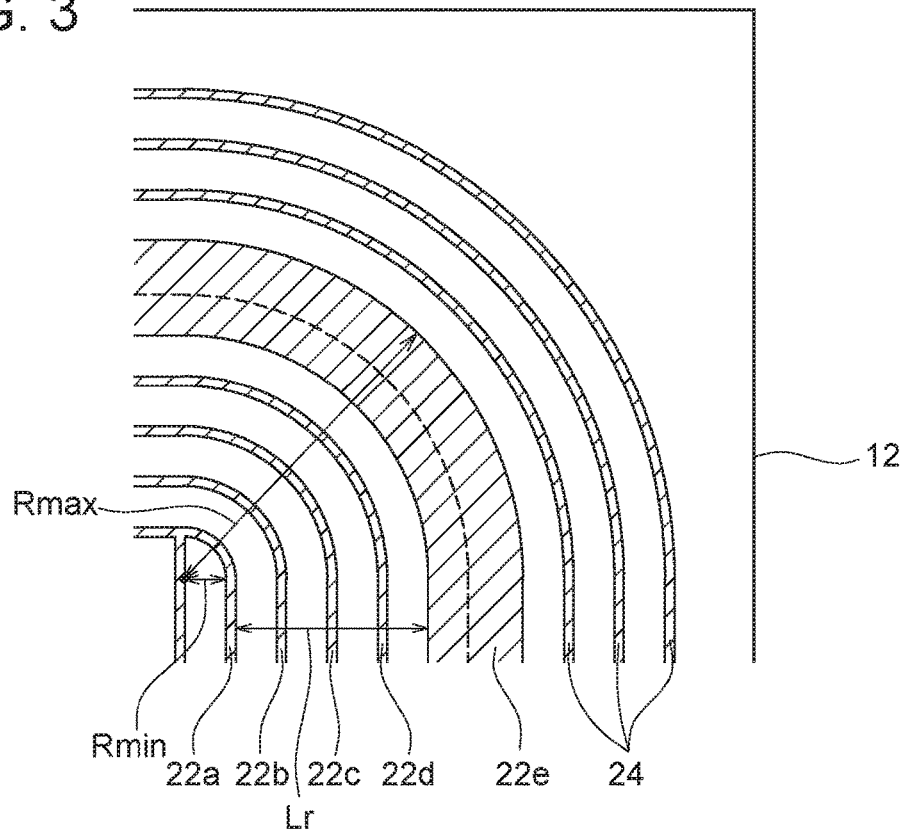
FIG. 3 is an enlarged view of corner portions of ring p-type contact regions 22a to 22e.

As shown in FIG. 3, the corner portions of the ring p-type contact regions 22a to 22e are shaped in concentric circular arcs. More specifically, boundary lines of the corner portions (i.e. boundary lines between each of the p-type regions and the n-type region) are shaped in concentric circular arcs. For this reason, radiuses of the corner portions of the ring p-type contact regions 22a to 22e increase as the ring p-type contact regions 22a to 22e are located closer to the outer side and decrease as the ring p-type contact regions 22a to 22e are located closer to the inner side. Because of such a structure, the ring p-type contact regions 22a to 22e have widths that are substantially constant from the linear portions to the corner portions. Further, as shown in FIG. 3, an interval Lr between the ring p-type contact region 22a located on an innermost side and the ring p-type contact region 22e located on the outermost side is larger than a radius Rmin of the corner portion located on the innermost side.

As shown in FIGS. 1 and 2, the stripe patterned p-type contact regions 20 are located in an inner portion of the ring p-type contact region 22a located on the innermost side. The stripe patterned p-type contact regions 20 linearly extend parallel to each other. Each of the stripe patterned p-type contact regions 20 is connected to the ring p-type contact region 22a at both ends of the stripe patterned p-type contact regions 20.

The FLRs 24 are p-type semiconductor regions. Each of the FLRs 24 is provided in the peripheral region 13, and extends circularly so as to surround the anode electrode 14. The FLRs 24 are located so that the FLRs 24 are arranged at intervals from the outer side to the inner side. Each of the FLRs 24 has a quadrangular shape having corners chamfered in circular arcs. Each of the FLRs 24 has linear portions each shaped in a straight line and corner portions each shaped in a circular arc. As shown in FIG. 3, the corner portions of the FLRs 24 are shaped in concentric circular arcs with the corner portions of the ring p-type contact regions 22. Because of such a structure, the FLRs 24 have widths that are substantially constant from the linear portions to the corner portions.

As shown in FIGS. 1 and 2, the SBD 10 includes the five ring p-type contact regions 22a to 22e and the three FLRs 24. That is, a number of the ring p-type contact regions 22 is larger than a number of the FLRs 24.

The drift region 26 is an n-type semiconductor region. The drift region 26 has a low density of n-type impurities. In the present embodiment, the drift region 26 has a density of n-type impurities of $9.5 \times 10^{15}$ atoms/cm$^3$ or lower. The drift region 26 is located under the stripe patterned p-type contact regions 20, the ring p-type contact regions 22, and the FLRs 24. Further, in a position where the stripe patterned p-type contact regions 20 and the ring p-type contact regions 22 are not provided, the drift region 26 extends up to the upper surface 12a (i.e. the contact surface 15) of the semiconductor substrate 12 and is in contact with the anode electrode 14 by Schottky contact. Further, in a position in the peripheral region 13 where the FLRs 24 are not provided, the drift region 26 extends up to the upper surface 12a of the semiconductor substrate 12. As mentioned above, the stripe patterned p-type contact regions 20 are connected to the ring p-type contact region 22 located on the innermost side. Except for these connected portions, the drift region 26 is provided in regions between the p-type regions 20, 22, and 24. The ring p-type contact regions 22 and the FLRs 24 are separated from each other by the drift region 26.

The cathode region 28 is an n-type semiconductor region. The cathode region 28 has a density of n-type impurities higher than that of the drift region 26. In the present embodiment, the cathode region 28 has a density of n-type impurities of $3.0 \times 10^{18}$ atoms/cm$^3$ or higher. Further, the cathode region 28 has a resistivity of 15 to 25 mΩ·cm. The cathode region 28 is located under the drift region 26. The cathode region 28 is provided in a range exposed on the lower surface 12b of the semiconductor substrate 12. The cathode region 28 is in contact with the cathode electrode 16 by ohmic contact. The cathode region 28 is separated from the stripe patterned p-type contact regions 20, the ring p-type contact regions 22, and the FLRs 24 by the drift region 26. An interval W is provided between each of the p-type regions 20, 22, and 24 and the cathode region 28 in a thickness direction of the semiconductor substrate 12.

The following describes how the SBD 10 operates. Application of a forward voltage (i.e. a voltage that causes the anode electrode 14 to be higher in potential than the cathode electrode 16) to the SBD 10 causes electrons to flow from the drift region 26 to the anode electrode 14 through a Schottky interface between the anode electrode 14 and the drift region 26. That is, electrons flow from the cathode electrode 16 to the anode electrode 14 via the cathode region 28 and the drift region 26. This causes the SBD 10 to be turned on. Further, in the SBD 10, no current flows through the p-type regions 20 and 22. That is, the SBD 10 is a JBSD.

Thereafter, application of a backward voltage to the SBD 10 stops the flow of electrons, thus causing the SBD 10 to be turned off. Further, when the SBD 10 is turned off, depletion layer spreads from the p-type contact regions 20 and 22 to portions of the drift region 26 that are located around the p-type contact regions 20 and 22.

Figure 4:
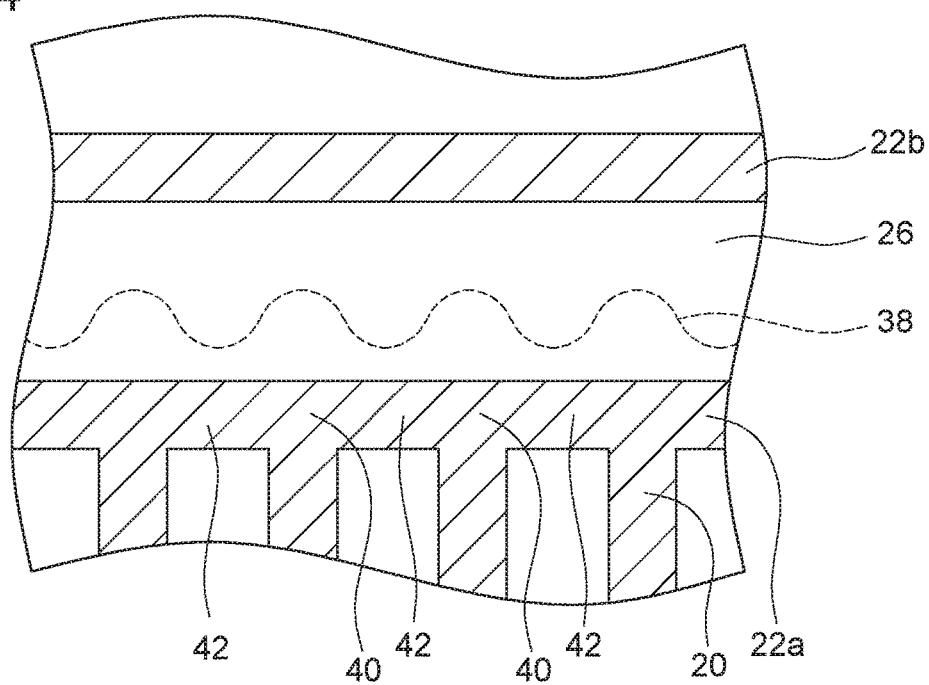

The application of a backward voltage causes the drift region 26 exposed on the contact surface 15 to be pinched off by the depletion layers spreading from the p-type regions 20 and 22 on both sides of the drift region 26. This prevents application of a high voltage to the Schottky interface between the anode electrode 14 and the drift region 26. In FIG. 4, a dotted line 38 shows a shape of a depletion layer in a process of extending from the ring p-type contact region 22a located on the innermost side to an outer portion of the ring p-type contact region 22a. As noted above, the plurality of stripe patterned p-type contact regions 20 are connected to the ring p-type contact region 22a. For this reason, areas in vicinity of connected portions 40 at which the ring p-type contact region 22a and the stripe patterned p-type contact regions 20 are connected to each other have a high p-type region ratio. Therefore, the depletion layer easily extends into a portion of the drift region 26 that is at an outer portion of the connected portions 40. Contrary to this, areas in vicinity of portions 42 (hereinafter referred to as "non-connected portions 42") other than the connected portions 40 have a low p-type region ratio. Therefore, it is harder for the depletion layer to extend into a portion of the drift region 26 that is an outer portion of the non-connected portions 42. As a result, the depletion layer is greater in width in the areas in vicinity of the connected portions 40 than in the areas in vicinity of the non-connected portions 42. That is, the depletion layer has its edge in a wavy shape. However, even when the depletion layer has its edge in such a wavy shape, a portion of the drift region 26 that is located between the ring p-type contact region 22a and the ring p-type contact region 22b is quickly pinched off by the depletion layer extending from the circular p type contact region 22a and the depletion layer extending from the ring p-type contact region 22b. Therefore, the wavy-edged depletion layer has little influence, and generation of a high electric field in the portion of the drift region 26 that is located between the circular p type contact region 22a and the ring p-type contact region 22b is suppressed.

Further, as mentioned above, the radiuses of the corner portions of the ring p-type contact regions 22a to 22e decrease as the ring p-type contact regions 22a to 22e are located closer to the inner side. Therefore, the corner portions have substantially constant widths. This allows depletion layers to evenly spread from the corner portions to areas near the corner portions, respectively. This suppresses the generation of a high electric field in the areas in vicinity of the corner portions.

Further, in the peripheral region 13, a depletion layer spreads from the ring p-type contact region 22e located on the outermost side to an outer portion of the ring p-type contact region 22e. The depletion layer spreads over to a further outer side via the plurality of FLRs 24. This causes the peripheral region 13 to be depleted. In this way, the depletion layer extends from the inner side toward the outer side in the peripheral region 13. If the depletion layer extending from the ring p-type contact region 22e to the outer portion of the ring p-type contact region 22e has its outer edge in a wavy shape, the depletion layer spreads into the peripheral region 13 while keeping its wavy outer edge to some extent. For this reason, there is a risk that a high electric field may be generated locally in the peripheral region 13. In the present embodiment, however, no other p-type region is connected to the ring p-type contact region 22e located on the outermost side. That is, unlike the ring p-type contact region 22a, the ring circular p type contact region 22e does not have a connected portion 40. Therefore, the depletion layer extending from the ring circular p type contact region 22e to the outer portion of the ring circular p type contact region 22e has its outer edge not in a wavy shape, but in a flat shape. This prevents the generation of a high electric field in the peripheral region 13.

Further, the waviness of the depletion layer extending from the ring p-type contact region 22a located on the innermost side may influence electric field distribution in the peripheral region 13. In the SBD 10 according to the present embodiment, however, an interval Lr between the ring p-type contact region 22a and the ring p-type contact region 22e is larger than the radius Rmin of the corner portion located on the innermost side. The interval Lr is thus secured sufficiently wide. This curbs the influence on the peripheral region 13 by the wavy-edged depletion layer extending from the ring p-type contact region 22a. Further, in the SBD 10 according to the present embodiment, the number of the ring p-type contact regions 22 is larger than the number of the FLRs 24. That is, the many ring p-type contact regions 22b to 22d are provided between the ring p-type contact region 22a and the ring p-type contact region 22e. This also curbs the influence on the peripheral region 13 by the wavy-edged depletion layer extending from the ring p-type contact region 22a. Therefore, in the SBD 10, it is harder for electric field concentration to occur in the peripheral region 13.

By the depletion layer spreading as described above, the drift region 26 is depleted in a range indicated by a dotted line 50 in FIG. 1. By the drift region 26 being thus depleted, the SBD 10 achieves high withstand voltage.

Once the depletion layer reaches the cathode region 28 (i.e. the region having a high density of n-type impurities), downward spreading of the depletion layer stops. Therefore, the interval W in FIG. 1 is a width of the depletion layer in the thickness direction in a case where the depletion layer extends most widely. As mentioned above, the radius Rmax of the corner portion of the ring p-type contact region 22e located on the outermost side is greater than the interval W. By thus making the radius Rmax larger, electric field concentration in an area in vicinity of the corner portion can be further suppressed.

In manufacturing an SBD 10, stripe patterned p-type contact regions 20, ring p-type contact regions 22, and FLRs 24 can be formed by a single implantation of p-type impurities. In this case, a mask having openings corresponding in shape to the p-type regions 20, 22, and 24 is formed on a surface of an n-type semiconductor substrate. Next, p-type impurities are implanted into the n-type semiconductor substrate via the mask. This causes the stripe patterned p-type contact regions 20 and a plurality of ring p-type regions (i.e. the ring p-type contact regions 22 and FLRs 24) to be formed. Next, an anode electrode 14 is formed so as to be in contact with the stripe patterned p-type contact regions 20 and a first plurality of the ring p-type regions located on an inner side and so as not to be in contact with a second plurality of the ring p-type regions located on an outer side. This causes the anode electrode 14 to be in contact by Schottky contact with the p-type and n-type regions located under the anode electrode 14. The first plurality of the ring p-type regions which are in contact with the anode electrode 14 by Schottky contact serve as the ring p-type contact regions 22. Further, the second plurality of the ring p-type regions which are not in contact with the anode electrode 14 serve as the FLRs 24. In this way, the single implantation of p-type impurities can form the stripe patterned p-type contact regions 20, the ring p-type contact regions 22, and the FLRs 24.

Although, in the above embodiment, a JBSD has been described, a similar structure may alternatively be employed in an MPSD. Further, although, in the above embodiment, the p-type contact regions 20 and 22 are in contact with the anode electrode 14 by Schottky contact, the p-type contact regions 20 and 22 may alternatively be in contact with the anode electrode 14 by ohmic contact.

Figure 5:
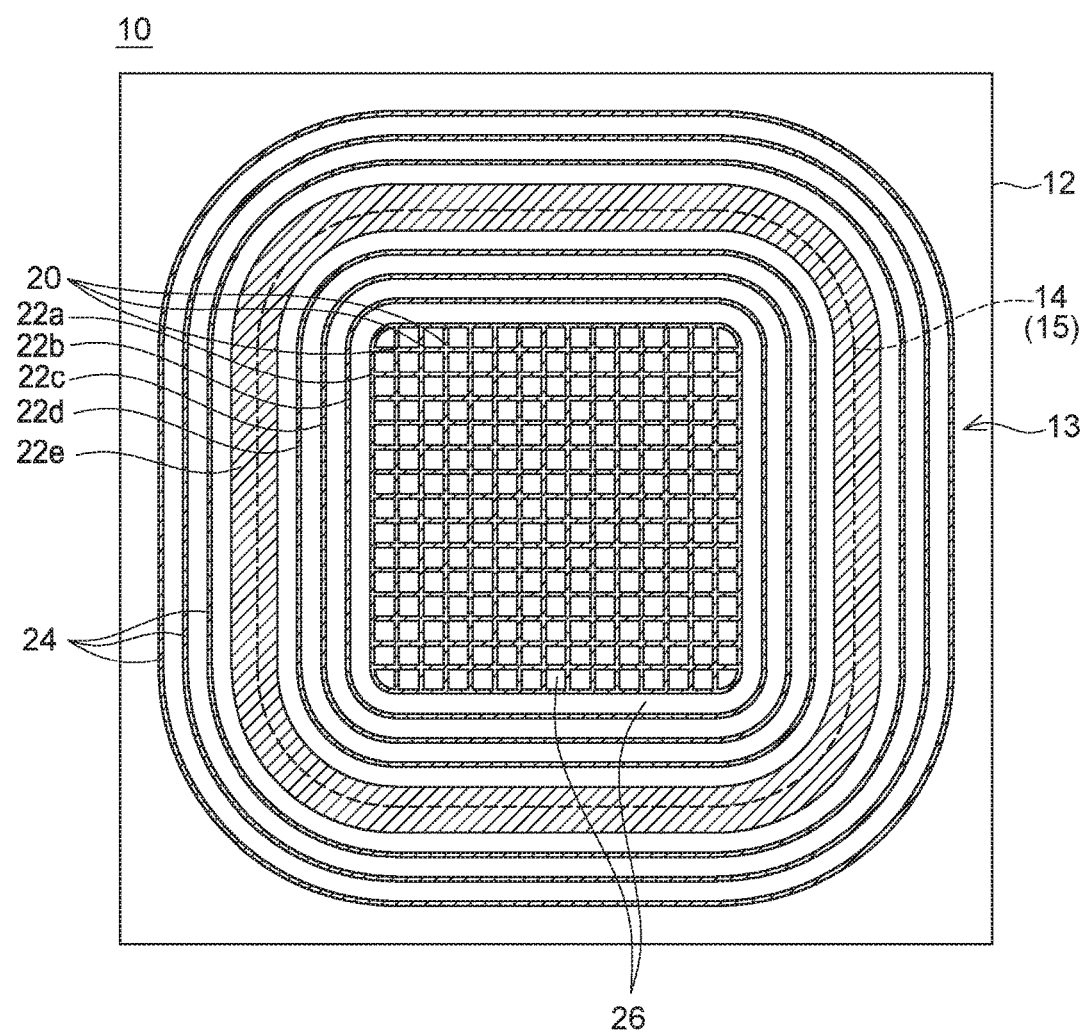
FIG. 5 is a top view of a semiconductor substrate 12 according to a modification.
Figure 6:
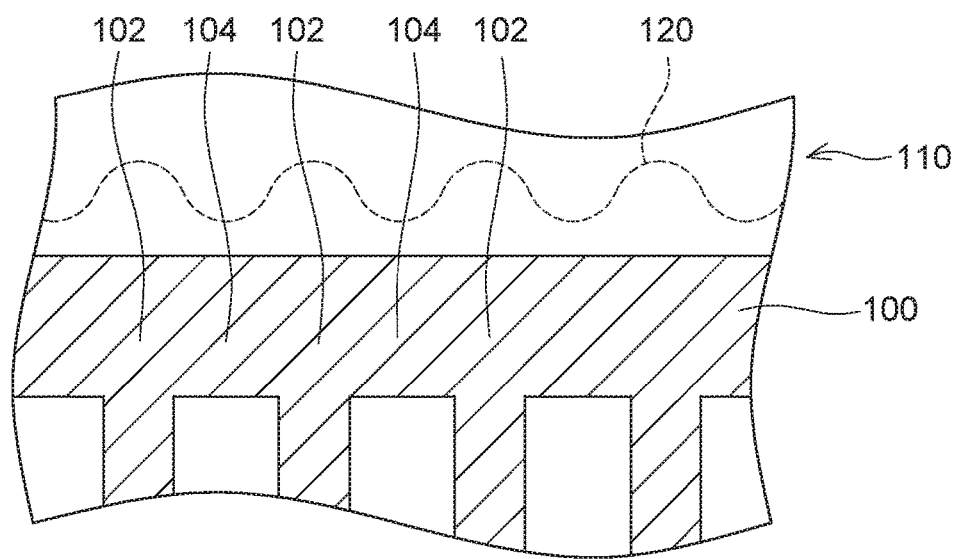
FIG. 6 is an explanatory diagram of a depletion layer extending into a peripheral region 110 of a conventional SBD.

Further, in the above embodiment, the stripe patterned p-type contact regions 20 are provided in an inner portion of the ring p-type contact region 22a located on the innermost side. Alternatively, a grid like p-type contact region 20 shown in FIG. 5 or a p-type contact region of another shape may be provided in the inner portion of the ring p-type contact region 22a located on the innermost side. That is, a p-type contact region provided in the inner portion of the ring p-type contact region 22a located on the innermost side may be of any shape, as long as the p-type contact region is connected to the ring p-type contact region 22a.

A relationship between the components of above embodiment and the components of the claims will be described. The "stripe patterned p-type contact regions 20" and the "ring p-type contact regions 22" of the embodiment are an example of the "p-type contact regions" of the claims. The "ring p-type contact regions 22" of the embodiment are an example of the "ring regions" of the claims. The "stripe patterned p-type contact regions 20" of the embodiment are an example of the "internal region" of the claims. The "interval W" of the embodiment is an example of the "interval between the p-type contact region and the high density n-type region" of the claims. The "radius Rmax" of the embodiment is an example of the "radius of the corner portion located on an outermost side". The "interval Lr" of the embodiment is an example of the "interval between the ring region located on the innermost side and the ring region located on an outermost side". The "radius Rmin" of the embodiment is an example of the "radius of the corner portion located on the innermost side".

The following enumerates technical elements disclosed herein. It should be noted that the following technical elements are each independently useful.

In a configuration disclosed herein as an example, each of the ring regions may comprise a corner portion shaped in a circular arc. Radiuses of the circular arcs may decrease as the ring regions are located closer to an inner side.

This configuration makes it possible to better uniform the widths of the corner portions.

In a configuration disclosed herein as an example, an interval between the ring region located on the innermost side and the ring region located on an outermost side may be larger than a radius of the corner portion located on the innermost side.

In a configuration disclosed herein as an example, the semiconductor substrate may comprise a plurality of Field Limiting Rings (FLRs) each of which extends so as to surround the anode electrode. A number of the ring regions may be larger than a number of the FLRs.

In a configuration disclosed herein as an example, the semiconductor substrate may comprise a high density n-type region located under the n-type drift region and having a density of n-type impurities higher than that of the drift region. The p-type contact region may be separated from the high density n-type region by the n-type drift region. A radius of the corner portion located on an outermost side may be larger than an interval between the p-type contact region and the high density n-type region.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A Schottky barrier diode, comprising:
a semiconductor substrate; and
an anode electrode being in contact with the semiconductor substrate,
wherein
the semiconductor substrate comprises:
p-type contact regions being in contact with the anode electrode; and
an n-type drift region being in contact with the anode electrode by Schottky contact in a range where the p-type contact regions are not provided, and
the p-type contact regions comprise:
a plurality of ring regions separated from each other by the n-type drift region and located so that the ring regions are arranged at intervals from an outer side to an inner side at a contact surface between the semiconductor substrate and the anode electrode;
the n-type drift region is in contact with the anode electrode by Schottky contact at each interval; and
an internal region located in an inner portion of the ring region of the plurality of the ring regions located on an innermost side at the contact surface and connected to the ring region located on the innermost side at the contact surface.

2. The Schottky barrier diode of claim 1, wherein
each of the ring regions comprises a corner portion shaped in a circular arc,
radiuses of the circular arcs decrease as the ring regions are located closer to an inner side.

3. The Schottky barrier diode of claim 2, wherein
an interval between the ring region located on the innermost side and the ring region located on an outermost side is larger than a radius of the corner portion located on the innermost side.

4. The Schottky barrier diode of claim 1, wherein
the semiconductor substrate comprises a plurality of Field Limiting Rings (FLRs) each of which extends so as to surround the anode electrode, and
a number of the ring regions is larger than a number of the FLRs.

5. The Schottky barrier diode of claim 2, wherein
the semiconductor substrate comprises a high density n-type region located under the n-type drift region and having a density of n-type impurities higher than that of the drift region,
the p-type contact region is separated from the high density n-type region by the n-type drift region,
a radius of the corner portion located on an outermost side is larger than an interval between the p-type contact region and the high density n-type region.

6. The Schottky barrier diode of claim 2, wherein the ring regions have quadrangular shapes having corners chamfered in a form of circular arcs.

7. A method for manufacturing a Schottky barrier diode, the method comprising:
implanting p-type impurities into a semiconductor substrate being of n-type to form p-type regions exposed on a surface of the semiconductor substrate,
the p-type regions comprising:
a plurality of ring regions, the plurality of ring regions separated from each other by an n-type drift region, the plurality of ring regions includes a first plurality of ring regions and a second plurality of ring regions, and
an internal region; and
forming an anode electrode on the surface of the semiconductor substrate, the anode electrode being in contact with the semiconductor substrate,
wherein the semiconductor substrate includes p-type contact regions, the p-type contact regions being in contact with the anode electrode,
wherein the plurality of ring regions are arranged at intervals from an outer side to an inner side at a contact surface between the semiconductor substrate and the anode electrode, the n-type drift region is in contact with the anode electrode by Schottky contact at each interval,
wherein the first plurality of ring regions are located on the inner side and the second plurality of ring regions are located on the outer side,
wherein the internal region is located in an inner portion of the ring region of the plurality of the ring regions located on an innermost side at the contact surface and connected to the ring region located on the innermost side at the contact surface,
wherein the anode electrode is in contact with the internal region and the first plurality of ring regions, is not in contact with the second plurality of ring regions, and is in contact by Schottky contact with an n-type region exposed on the surface of the semiconductor substrate in a range where the p-type regions are not formed.

* * * * *